United States Patent
Lichtenwalner et al.

(10) Patent No.: US 11,869,948 B2
(45) Date of Patent: Jan. 9, 2024

(54) POWER SEMICONDUCTOR DEVICE WITH REDUCED STRAIN

(71) Applicant: Wolfspeed, Inc., Durham, NC (US)

(72) Inventors: Daniel Jenner Lichtenwalner, Raleigh, NC (US); Edward Robert Van Brunt, Raleigh, NC (US); Thomas E. Harrington, III, Carrollton, TX (US); Shadi Sabri, Apex, NC (US); Brett Hull, Raleigh, NC (US); Brice McPherson, Fayetteville, AR (US); Joe W. McPherson, Plano, TX (US)

(73) Assignee: Wolfspeed, Inc., Durham, NC (US)

( * ) Notice: Subject to any disclaimer, the term of this patent is extended or adjusted under 35 U.S.C. 154(b) by 243 days.

(21) Appl. No.: 17/177,641

(22) Filed: Feb. 17, 2021

(65) Prior Publication Data

US 2022/0262909 A1 Aug. 18, 2022

(51) Int. Cl.
*H01L 29/40* (2006.01)
*H01L 29/16* (2006.01)

(52) U.S. Cl.
CPC ........ *H01L 29/404* (2013.01); *H01L 29/1608* (2013.01)

(58) Field of Classification Search
CPC ............... H01L 29/404; H01L 29/1608; H01L 23/4824; H01L 29/4238; H01L 23/562; H01L 23/585
USPC ........................................................ 257/488
See application file for complete search history.

(56) References Cited

U.S. PATENT DOCUMENTS

| | | | | |
|---|---|---|---|---|
| 5,763,915 A | * | 6/1998 | Hshieh | H01L 29/7813 257/334 |
| 6,104,060 A | * | 8/2000 | Hshieh | H01L 29/7811 257/329 |
| 7,652,326 B2 | * | 1/2010 | Kocon | H01L 29/402 257/E29.257 |
| 9,508,812 B2 | * | 11/2016 | Schulze | H01L 29/407 |
| 2008/0128803 A1 | * | 6/2008 | Hirler | H01L 29/407 257/E29.136 |
| 2008/0265427 A1 | | 10/2008 | Hirler et al. | |
| 2009/0079002 A1 | * | 3/2009 | Lee | H01L 21/26513 257/E23.001 |
| 2009/0230561 A1 | * | 9/2009 | Zundel | H01L 29/42372 257/E23.095 |
| 2010/0140697 A1 | * | 6/2010 | Yedinak | H01L 29/7813 257/334 |

(Continued)

FOREIGN PATENT DOCUMENTS

CN 101752375 A 6/2010

OTHER PUBLICATIONS

Invitation to Provide Informal Clarification for International Patent Application No. PCT/U2022/016644, dated May 25, 2022, 3 pages.

(Continued)

*Primary Examiner* — Mohammad M Hoque
(74) *Attorney, Agent, or Firm* — Myers Bigel, P.A.

(57) ABSTRACT

Strategic placement and patterning of electrodes, vias, and metal runners can significantly reduce strain in a power semiconductor die. By modifying the path defining electrodes, vias, and metal runners, as well as patterning the material layers thereof, strain can be better managed to increase reliability of a power semiconductor die.

31 Claims, 18 Drawing Sheets

(56) References Cited

U.S. PATENT DOCUMENTS

| | | | | |
|---|---|---|---|---|
| 2014/0070313 A1* | 3/2014 | Wang | .................. | H01L 29/0865 |
| | | | | 257/E29.256 |
| 2019/0267487 A1 | 8/2019 | Laforet et al. | | |
| 2021/0273117 A1* | 9/2021 | Hoshi | .................. | H01L 29/7815 |
| 2022/0165879 A1* | 5/2022 | Dainese | .............. | H01L 29/7813 |
| 2022/0190126 A1* | 6/2022 | Kabir | .................. | H01L 29/4238 |

OTHER PUBLICATIONS

International Search Report and Written Opinion for International Patent Application No. PCT/US2022/016644, dated Jul. 8, 2022, 17 pages.

* cited by examiner

POWER SEMICONDUCTOR DEVICE WITH REDUCED STRAIN

FIELD OF THE DISCLOSURE

The present disclosure is related to power semiconductor devices, and in particular to layout methods for reducing strain in power semiconductor devices.

BACKGROUND

Power semiconductor devices handle high voltages and currents, and therefore often experience large temperature swings. These large temperature swings can cause a large amount of strain on the various layers of the device, which in some cases can result in cracking, delamination, and failure. Accordingly, there is a need for power semiconductor devices with reduced strain.

SUMMARY

In one embodiment, a power semiconductor device includes a drift layer, an active region, an insulating layer, and a runner electrode. The runner electrode includes an electrically conductive material provided along a runner electrode path. The runner electrode path follows a perimeter of the active region. The runner electrode includes one or more runner electrode strain relief regions, which are regions wherein the electrically conductive material is not provided. Providing the one or more strain relief regions reduces strain caused by the runner electrode and thus improves the reliability of the power semiconductor device.

In one embodiment, the power semiconductor device further includes a runner via and a metal runner. The runner via is along a runner via path, and the metal runner is along a metal runner path. The runner via is an opening in the insulating layer through which the runner electrode is exposed. The metal runner fills the runner via to electrically contact the runner electrode.

In one embodiment, the runner via is segmented to provide a number of segmented runner vias separated by a portion of the insulating layer. By segmenting the runner via, strain caused by the runner via may be reduced, therein improving the reliability of the power semiconductor device.

In one embodiment, any of the runner electrode path, the runner via path, and the metal runner path may be different than the others. By providing the runner electrode, the runner via, and the metal runner in this manner, strain caused by these layers may be reduced, thereby improving the performance of the power semiconductor device.

In one embodiment, the runner electrode, the runner via, and the metal runner path are defined by an inner edge and an outer edge. In various embodiments, one of the inner edge or the outer edge is not parallel to the path defining the runner electrode, the runner via, and/or the metal runner path. By providing the runner electrode, the runner via, and/or the metal runner path in this manner, strain may be reduced thereby improving the reliability of the power semiconductor device.

In one embodiment, a switching power semiconductor device including an electrode assembly that is configured such that the switching power semiconductor device has a failure rate less than 2000 parts per million when subjected to a thermal cycling test wherein a temperature of the switching power semiconductor device is cycled between a minimum temperature less than or equal to −40° C. and a maximum temperature greater than or equal to 150° C.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
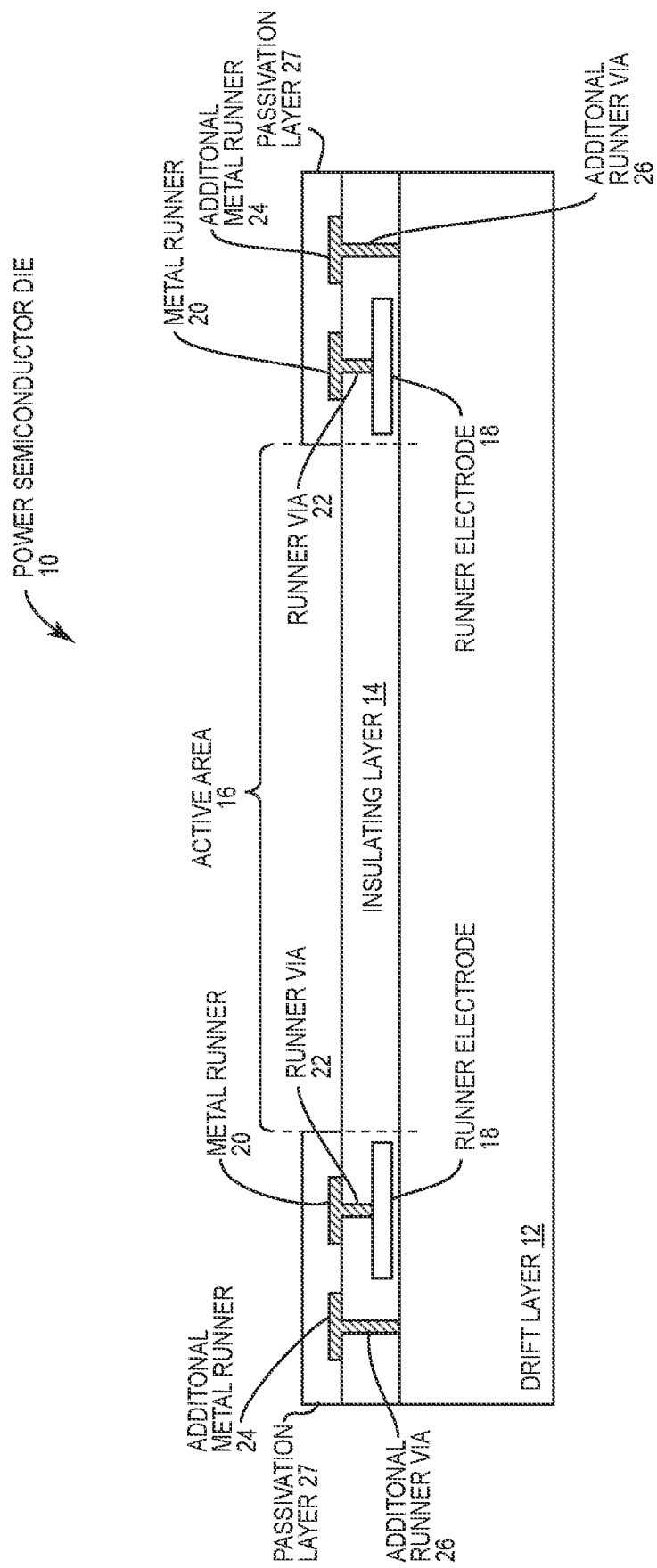
FIG. 1 is a cross-sectional view of a power semiconductor die according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 shows a cross-sectional view of a power semiconductor die 10 according to one embodiment of the present disclosure. The power semiconductor die 10 includes a drift layer 12 and an insulating layer 14 on the drift layer 12. The drift layer 12 includes an active area 16 in a central portion thereof. A runner electrode 18 surrounds the active area 16. The runner electrode 18 is separated from the drift layer 12 by a portion of the insulating layer 14. A metal runner 20 is over the runner electrode 18 on a surface of the insulating layer 14 opposite the drift layer 12. A runner via 22 electrically connects the metal runner 20 and the runner electrode 18 by providing an opening in the insulating layer 14, which is filled by a portion of the metal runner 20. An additional metal runner 24 is over a portion of the drift layer 12 outside of the metal runner 20 on a surface of the insulating layer 14 opposite the drift layer 12. An additional runner via 26 electrically connects the additional metal runner 24 to the drift layer 12 by providing an opening in the insulating layer 14, which is filled by a portion of the additional metal runner 24. A passivation layer 27 is over the metal runner 20 and the additional metal runner 24. The passivation layer 27 electrically isolates and protects the metal runner 20 and the additional metal runner 24 from the environment.

While not shown, the active area 16 of the drift layer 12 includes several implanted regions, which are interconnected to provide one or more power semiconductor devices such as transistors (e.g., metal-oxide-semiconductor field-effect transistors (MOSFETs), insulated gate bipolar transistors (IGBTs), diodes, and the like). The metal runner 20 is electrically coupled to one or more of these implants by the runner electrode 18, which is in turn coupled to the one or more implants via an electrode mesh, which extends from the runner electrode 18 into the active area 16 but is not shown in FIG. 1. The additional metal runner 24 is electrically coupled to one or more other implants by one or more implanted regions in the drift layer 16, which are also not shown in FIG. 1.

In one exemplary embodiment wherein the power semiconductor die 10 provides a MOSFET, the runner electrode 18 may be a runner for a gate electrode such that the metal runner 20 is coupled to a gate contact and distributes a gate current to the gate electrode. In this example, the additional metal runner 24 is coupled to a source contact and distributes a source current to the one or more implanted regions in the drift layer 12. Those skilled in the art will appreciate that additional parts of the power semiconductor die 10 which are not directly relevant to the present disclosure are not shown in FIG. 1 to avoid obscuring the drawings.

In some embodiments, the drift layer 12 may comprise silicon carbide. However, the present disclosure is not limited to a particular material system for the drift layer 12. In various embodiments, the drift layer 12 may comprise silicon, gallium nitride, gallium arsenide, or any other semiconductor material. The insulating layer 14 may comprise any suitable electrically insulating material.

In one embodiment, the insulating layer 14 comprises a dielectric material such as silicon dioxide. The runner electrode 18 may comprise any suitable electrically conductive material. In one embodiment, the runner electrode 18 comprises doped polysilicon. The metal runner 20 and the additional metal runner 24 may comprise any suitable electrically conductive metal such as copper, aluminum, tin, or a metal alloy. In various embodiments, the portion of the metal runner 20 filling the runner via 22 may be the same or a different material than the portion of the metal runner 20 on the surface of the insulating layer 14, and they may be deposited together or separately. Similarly, the portion of the additional metal runner 24 filling the additional runner via 26 may be the same or a different material than the portion of the additional metal runner 24 on the surface of the insulating layer 14, and they may be deposited together or separately.

Figure 2:
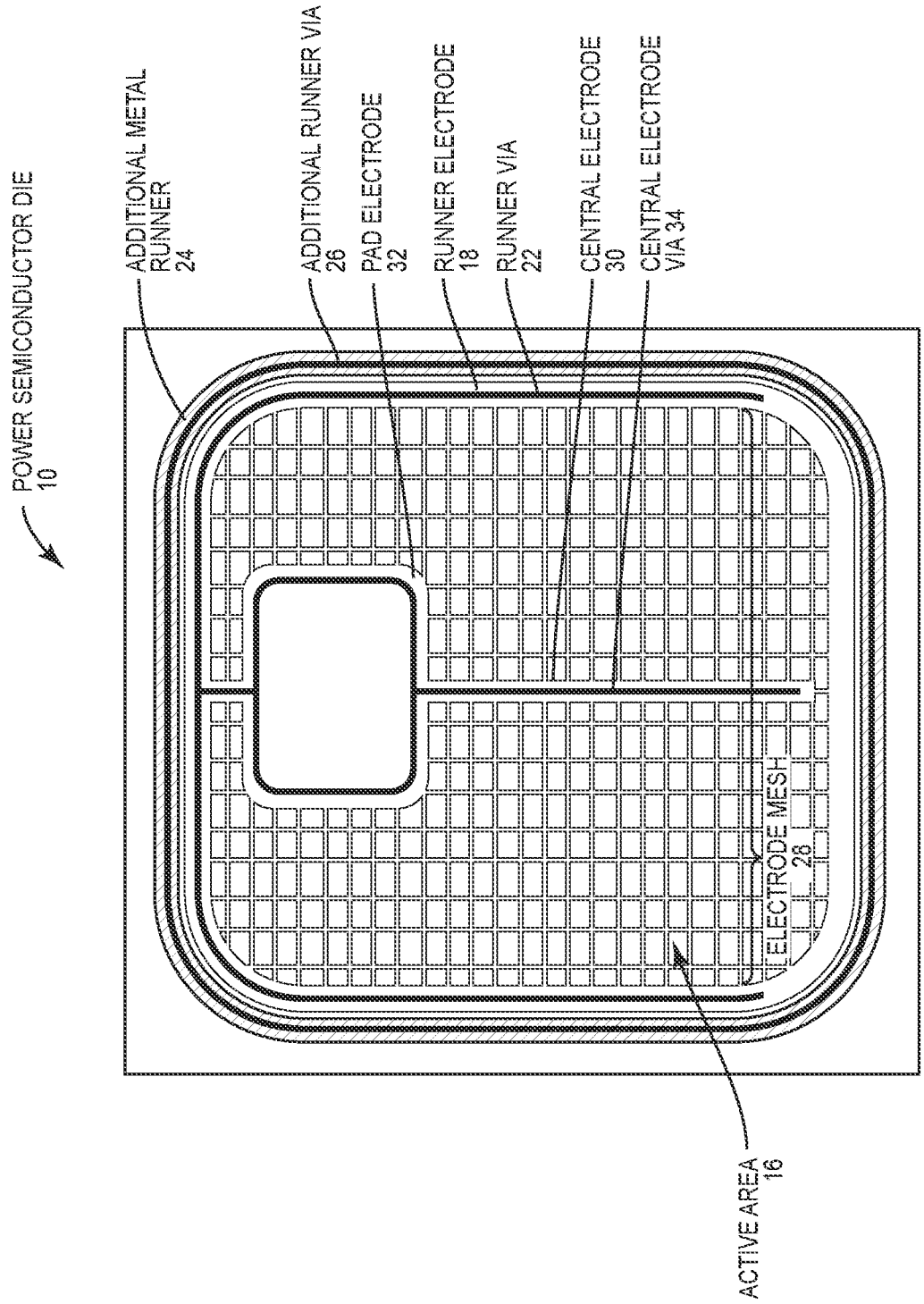
FIG. 2 is a top-down view of a power semiconductor die according to one embodiment of the present disclosure.

FIG. 2 shows a top-down view of the power semiconductor die 10 according to one embodiment of the present disclosure. Notably, the passivation layer 27 and the metal runner 20 are not shown to avoid obscuring the drawing. As shown, the runner electrode 18, the metal runner 20 (not shown, but still present), and the runner via 22 surround the active area 16. The additional metal runner 24 and the additional runner via 26 in turn surround the runner electrode 18, the metal runner 20, and the runner via 22. The reason for providing the metal runner 20 and the additional metal runner 26 around the perimeter of the power semiconductor die 10 as shown is to better distribute current around the power semiconductor die 10 and thus reduce resistance. For example, in the example case above wherein the power semiconductor die 10 provides a MOSFET such that the metal runner 20 is a gate contact and the additional metal runner 24 is a source contact, it is important that the resistance of these contacts be minimized for the performance of the MOSFET. As shown in FIG. 2, an electrode mesh 28 is provided over the active area 16 and is electrically coupled to the runner electrode 18. A central electrode 30 extends over a central portion of the active area 16. A pad electrode 32 is overlaid on the central electrode 30. A central electrode via 34 electrically couples the central electrode 30 and the pad electrode 32 to a metal contact pad, which is a metal layer provided over the pad electrode 32 on the insulating layer 14 and is used to couple external circuitry to the power semiconductor die 10. The metal contact pad is not shown to avoid obscuring the drawings, but will be provided in a similar shape to the pad electrode 32 directly over the pad electrode 32.

Figure 3:
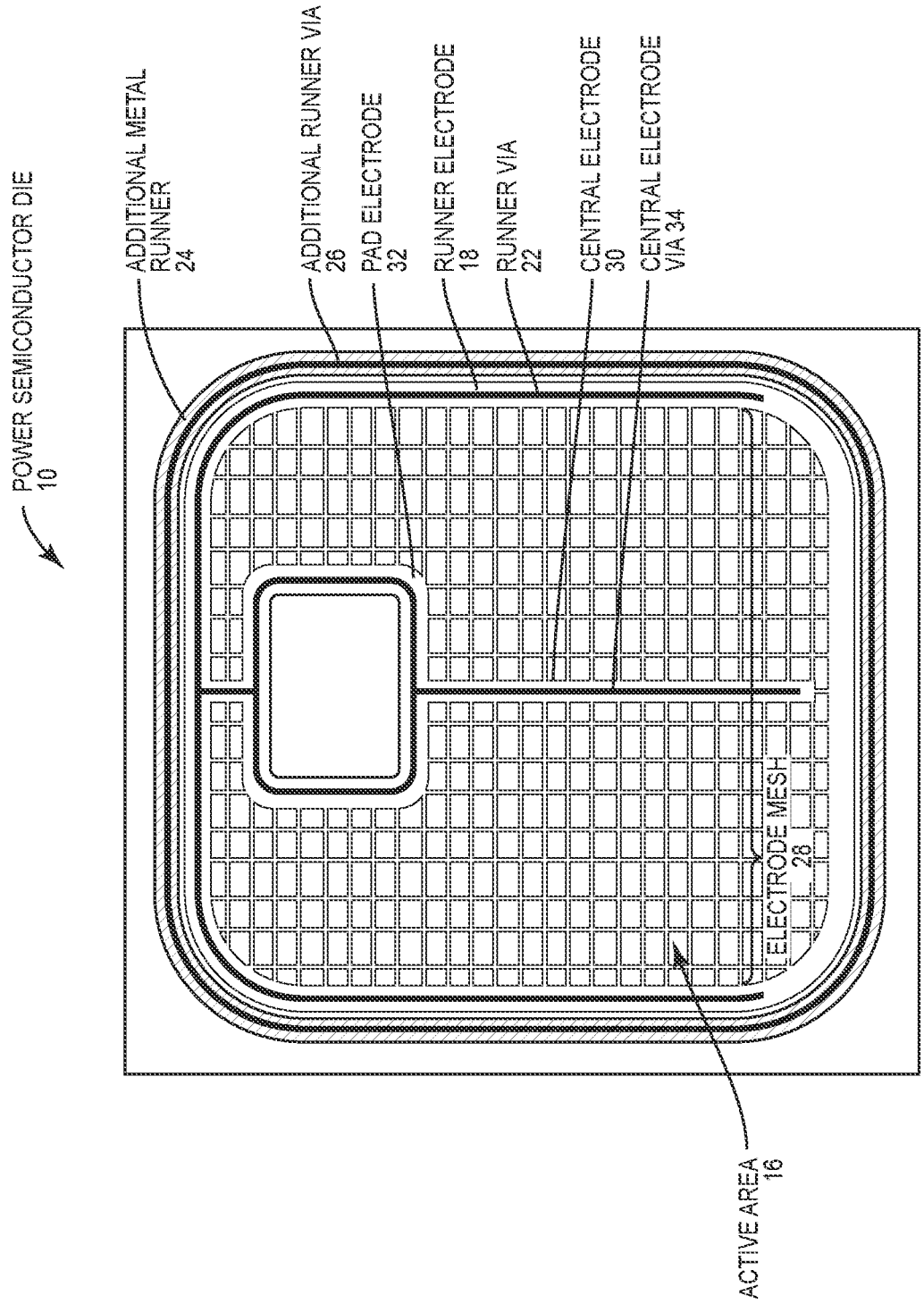
FIG. 3 is a top-down view of a power semiconductor die according to one embodiment of the present disclosure.
Figure 4:
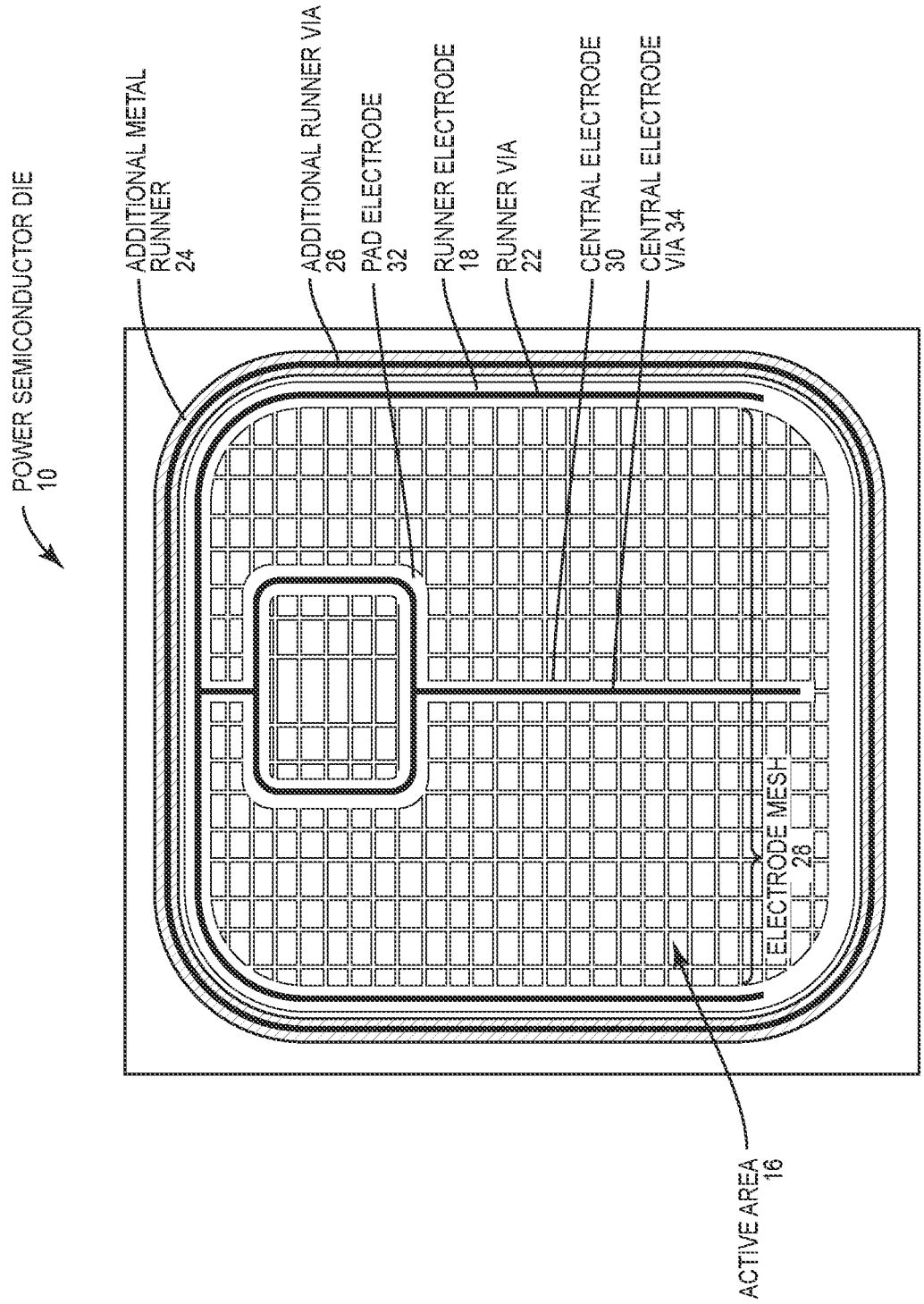
FIG. 4 is a top-down view of a power semiconductor die according to one embodiment of the present disclosure.

Generally, there are two areas that experience a high degree of strain in the power semiconductor die 10 during thermal cycling. First, the power semiconductor die 10 will experience a high degree of strain in the area defining the pad electrode 32. In order to reduce the amount of strain in this area, the pad electrode 32 can be provided only under the central electrode via 34 as shown in FIG. 3. By significantly reducing the amount of material in the pad electrode 32, the strain caused by the pad electrode 32 may be significantly reduced. In applications wherein there is a need to control gate capacitance, the pad electrode 32 may be provided as a solid border with an inner meshed portion as shown in FIG. 4. In both FIGS. 3 and 4 the runner electrode 18 may also be narrowed to provide a reduced width. By reducing the amount of material in the runner electrode 18, strain caused by the runner electrode 18 may be reduced as well. In various embodiments, the surface area of the pad electrode 32 is reduced such that it is less than 50% a surface area of the pad electrode 32, less than 25% a surface area of the pad electrode 32, and less than 10% of the surface area of the pad electrode 32.

In addition to the pad electrode 32, the corners of the power semiconductor die 10 are also subject to a very high degree of strain during thermal cycling. In particular, the runner electrode 18, the metal runner 20, the runner via 22, the additional metal runner 24, and the additional runner via 26 may all experience a high degree of strain as they approach the corners of the power semiconductor die 10. This strain may cause delamination, cracking, and even breakage of the various layers. This in turn may cause failure of the power semiconductor die 10.

Figure 5A:
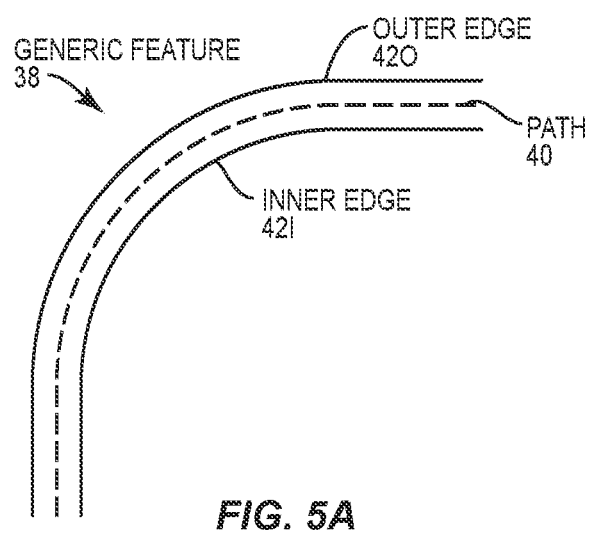
FIGS. 5A through 5C illustrate a generic feature of a power semiconductor die according to one embodiment of the present disclosure.
Figure 5B:
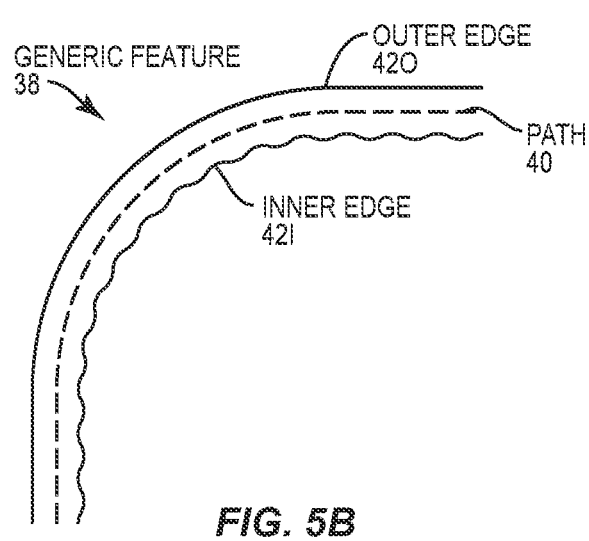
Figure 5C:
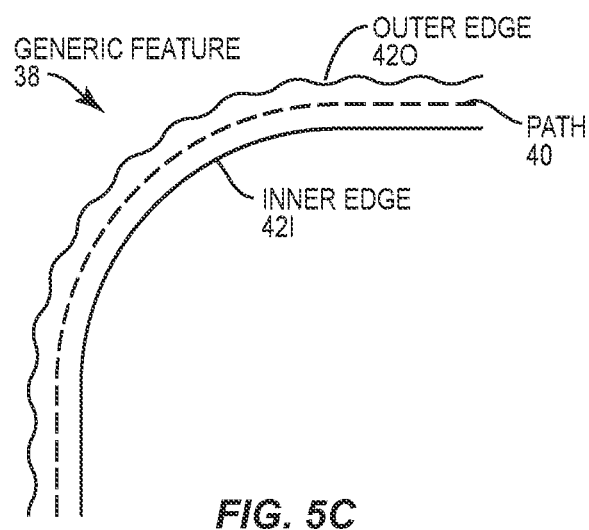

In an effort to aid the discussion of further embodiments of the present disclosure, FIG. 5A shows a generic feature 38 of a semiconductor die according to one embodiment of the present disclosure. The generic feature 38 is defined by a path 40, which defines the general shape of the generic feature 38. The generic feature 38 also has a width, which is defined as a distance between an inner edge 421 and an outer edge 420. The material making up the feature is provided between the inner edge 421 and the outer edge 420. In the simplest case, the inner edge 421 and the outer edge 420 are provided parallel to the path 40 as shown in FIG. 5A. However, sometimes one of the inner edge 421 or the outer edge 420 may be provided such that it is not parallel to the path 40. Accordingly, FIG. 5B shows the inner edge 421 such that it is not parallel to the path 40, while FIG. 5C shows the outer edge 420 such that it is not parallel to the path 40. Notably, at least one of the inner edge 421 and the outer edge 420 is always parallel to the path 40. If not otherwise mentioned, it can be assumed that both the inner edge 421 and the outer edge 420 are parallel to the path 40. To avoid obscuring the drawings while discussing the embodiments below, the paths and edges of the various features will be discussed but not illustrated in the drawings. The paths and edges are defined as discussed herein with respect to FIGS. 5A through 5C. With respect to the metal runner 20 and the additional metal runner 24, the inner edge and outer edge thereof are defined by the edges on the surface of the insulating layer 14 opposite the drift layer 12, and not by the edges within the runner via 22 and the additional runner via 24, respectively.

Figure 6:
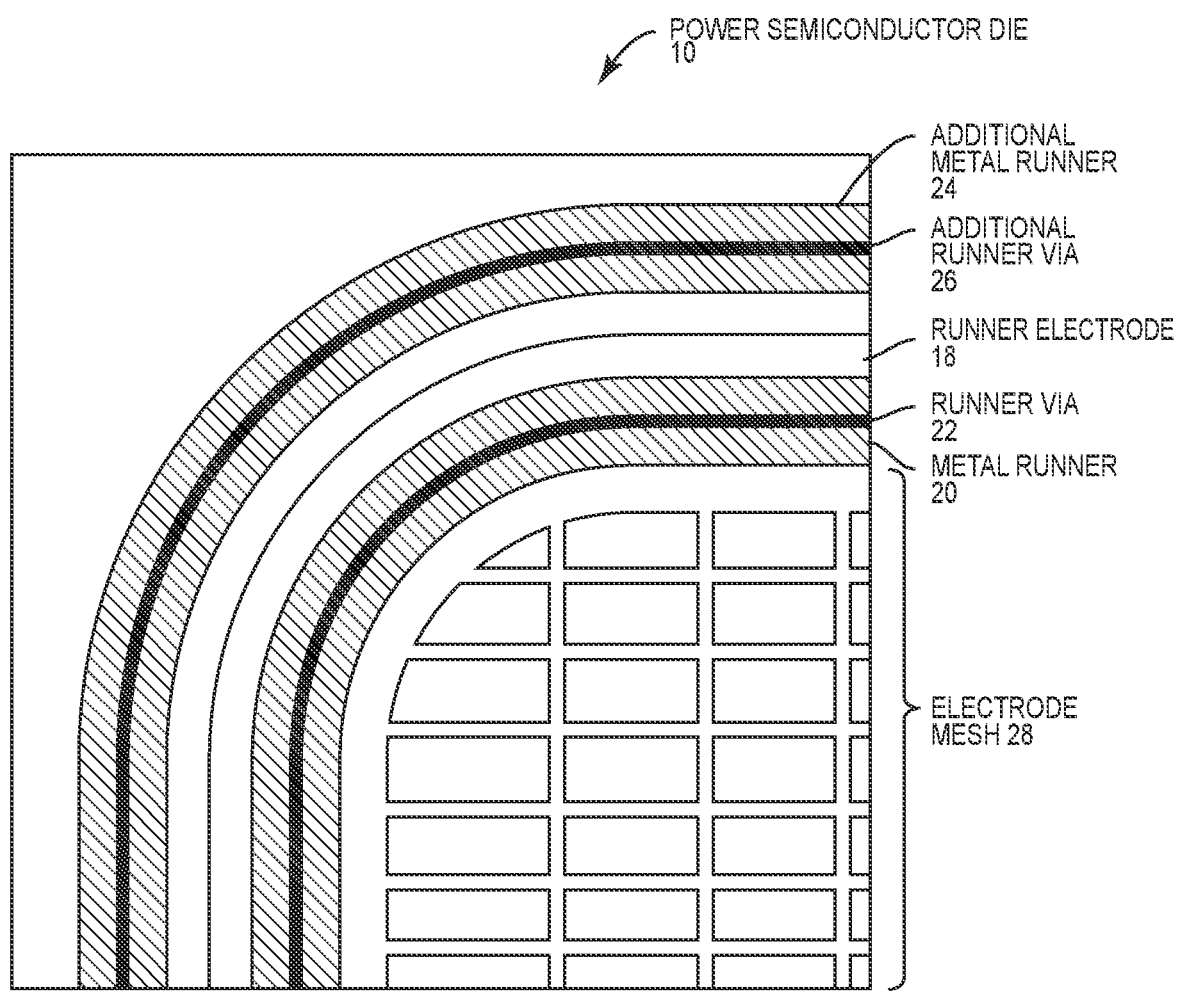
FIG. 6 is a top-down view of a corner of a power semiconductor die according to one embodiment of the present disclosure.

FIG. 6 shows a top-down view of a corner of the power semiconductor die 10 according to one embodiment of the present disclosure. The passivation layer 27 is not shown to avoid obscuring the drawing. As shown, the path of the runner electrode 18 does not follow the contours of the perimeter of the power semiconductor die 10 but rather provides a soft curve at the corner thereof. The path of the metal runner 20 and the path of the runner via 22 overlap the path of the runner electrode 18. Similarly, the additional metal runner 24 and the additional runner via 26 provide a soft curve at the corner of the power semiconductor die 10 and have overlapping paths. Providing a soft curve at the corner of the power semiconductor die 10 reduces strain that would otherwise occur if these layers followed the perimeter of the power semiconductor die 10 into the corner thereof such that they provided a 90° angle. However, even the power semiconductor die 10 shown in FIG. 5 may experience a relatively high degree of strain and thus suffer from reliability problems during thermal cycling.

Figure 7A:
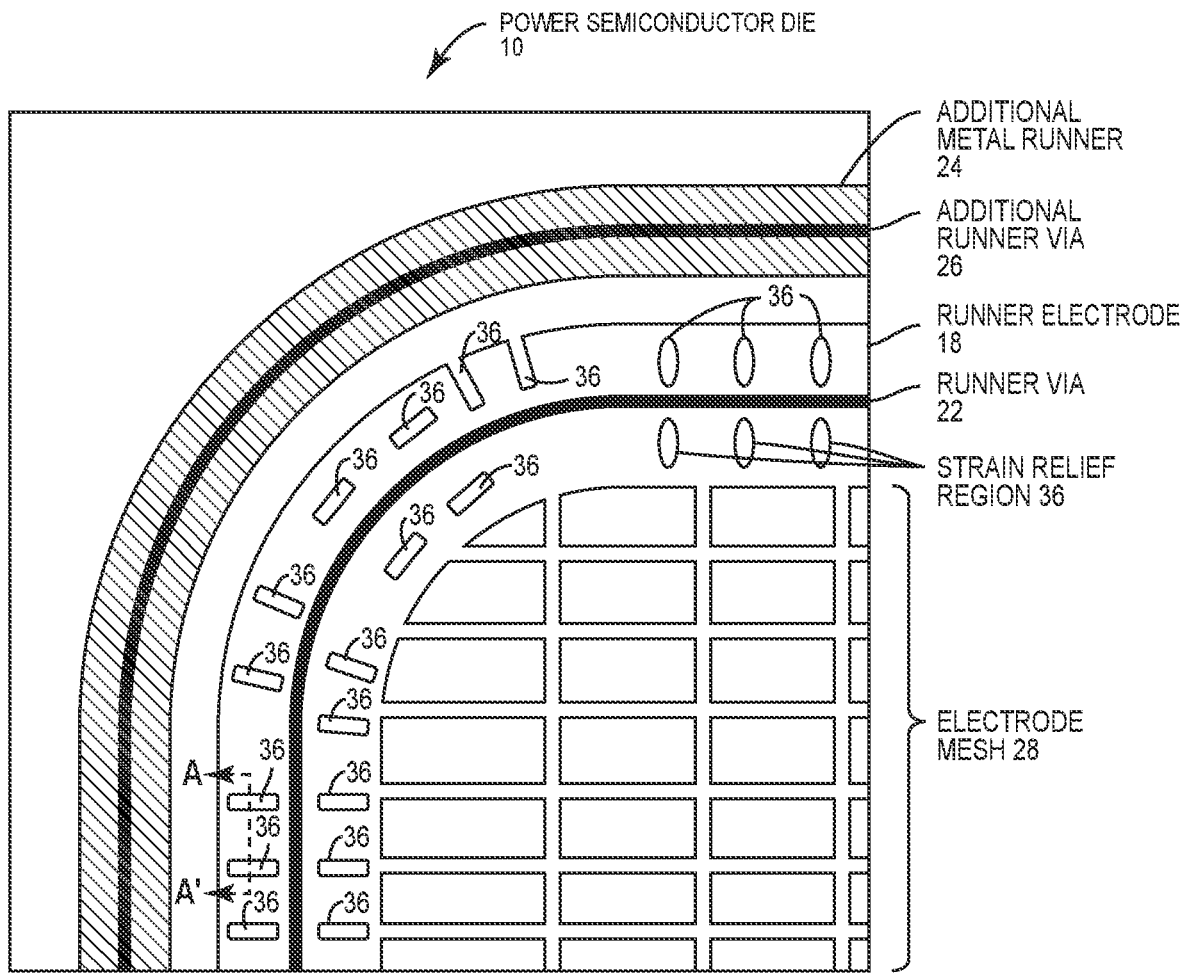
FIG. 7A is a top-down view of a corner of a power semiconductor die according to one embodiment of the present disclosure.

FIG. 7A shows a top-down view of a corner of the power semiconductor die 10 according to one embodiment of the present disclosure. The passivation layer 27 and the metal runner 20 are not shown to avoid obscuring the drawing. As shown in FIG. 7, the runner electrode 18 includes a number of strain relief regions 36, which are regions where the electrically conductive material of the runner electrode 18 is not provided. The strain relief regions 36 may be any shape, and so are shown in FIG. 7A in a variety of forms including ovals, radial slots, staggered slots, etc. The different shapes shown in FIG. 7A represent different embodiments, which may or may not be combined, such that the strain relief regions 36 may all be the same shape, or may be different shapes. As discussed above, the runner electrode 18 is defined by an inner edge and an outer edge, wherein electrically conductive material is provided between the edges. The strain relief regions 36 are provided between the inner edge and the outer edge of the runner electrode 18. Notably, the runner electrode 18 is separate from the electrode mesh 28. Where the electrode mesh 28 forms a grid including areas wherein electrically conductive material is not provided, the runner electrode 18 is typically provided as a continuous layer of electrically conductive material between the inner edge and the outer edge. By providing strain relief regions 36 in the runner electrode 18, strain caused by the runner electrode 18 may be disrupted and thus overall strain reduced, thus improving the reliability of the power semiconductor die 10. In one embodiment, the strain relief regions 36 are provided so that they are not intersected by a line defining the path of any individual runner (each line of electrically conductive material) in the electrode mesh 28. In other words, if each line of electrically conductive material of the electrode mesh 28 were extended out into the runner electrode 18, the strain relief regions 36 may be provided such that they are not intersected by any of these lines. This may prevent the strain relief regions 36 from impeding current flow from the runner electrode 18 to the electrode mesh 28. In some embodiments, the insulating layer 14 may fill the voids in the runner electrode 18 left by the strain relief regions 36. As shown, the strain relief regions 36 may be any shape including rectangular and circular, but may also be any other shape such as a polygon or an arbitrary shape.

Figure 7B:
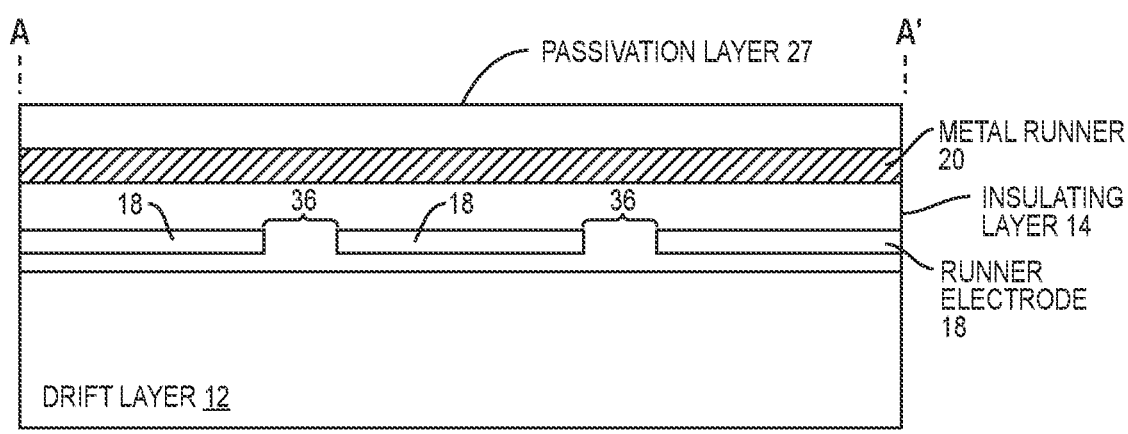
FIG. 7B is a cross-sectional view of a portion of a power semiconductor die according to one embodiment of the present disclosure.

FIG. 7B shows a cross-sectional view through A-A' of FIG. 7A to further illustrate the strain relief regions 36. As shown, the strain relief regions 36 are regions where the electrically conductive material of the runner electrode 18 is not provided such that the insulating layer 14 fills the regions. They do not affect the metal runner 20.

Figure 8A:
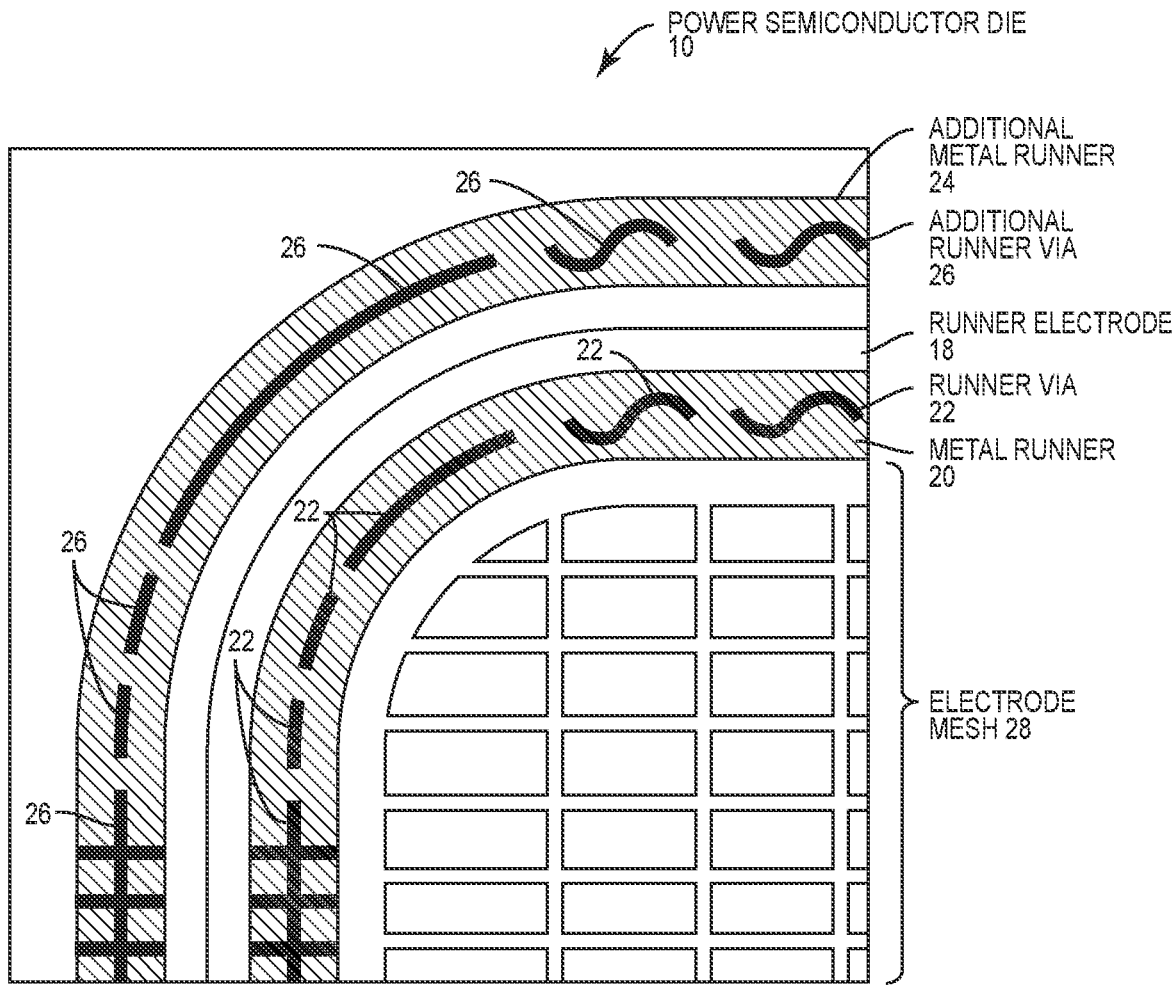
FIG. 8A is a top-down view of a corner of a power semiconductor die according to one embodiment of the present disclosure.

FIG. 8A shows a top-down view of a corner of the power semiconductor die 10 according to one embodiment of the present disclosure. The passivation layer 27 is not shown to avoid obscuring the drawing. As shown in FIG. 8A, the runner via 22 and the additional runner via 26 are altered in order to reduce strain. This may be accomplished in several ways, each of which may be used together or separately. The modifications are discussed herein with respect to the runner via 22, but apply equally to the additional runner via 26 or any other via. First, FIG. 8A shows that the runner via 22 may be segmented such that it is provided as a plurality of runner via sections 38. In other words, the runner via 22 is no longer provided as a continuous opening in the insulating layer 14, but rather is broken up by portions of the insulating layer 14 that are left intact. In addition to or separately from segmenting the runner via 22, the runner via 22 may also be provided such that the path of the runner via 22 is not the same as the path of the runner electrode 18 or the path of the metal runner 20.

In particular, the path of the runner via 22 may not completely overlap or be parallel to the path of the runner electrode 18 and/or the path of the metal runner 20. The path of the runner via 22 may be provided in a serpentine manner as shown, but can also be provided in any arbitrary manner such that it is different from or otherwise not parallel to the path of the runner electrode 18 and/or the path of the metal runner 20. Finally, in addition to or separately from segmenting the runner via 22 and/or providing the runner via 22 along a different path than the runner electrode 18 and the metal runner 20, the runner via 22 may be provided in a cross-hatched pattern wherein the runner via 22 provides at least a first portion that overlaps at least a second portion. In some embodiments, the first portion is perpendicular to the second portion. Together or separately, these modifications to the runner via 22 may reduce strain caused by the runner via 22, thus improving the reliability of the power semiconductor die 10.

Figure 8B:
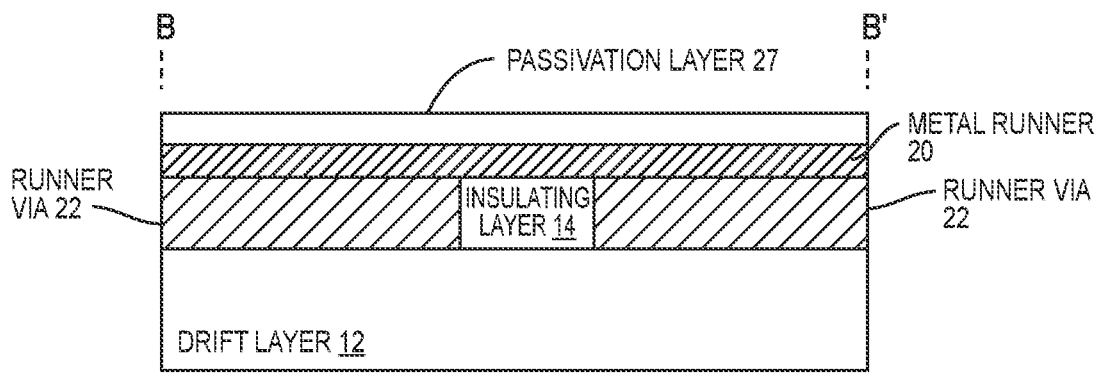
FIG. 8B is a cross-sectional view of a portion of a power semiconductor die according to one embodiment of the present disclosure.

FIG. 8B shows a cross-sectional view of the power semiconductor die 10 through line B-B' to illustrate the fact that the runner via 22 is segmented into two distinct runner via sections, which are separated by a portion of the insulating layer 14.

Figure 9A:
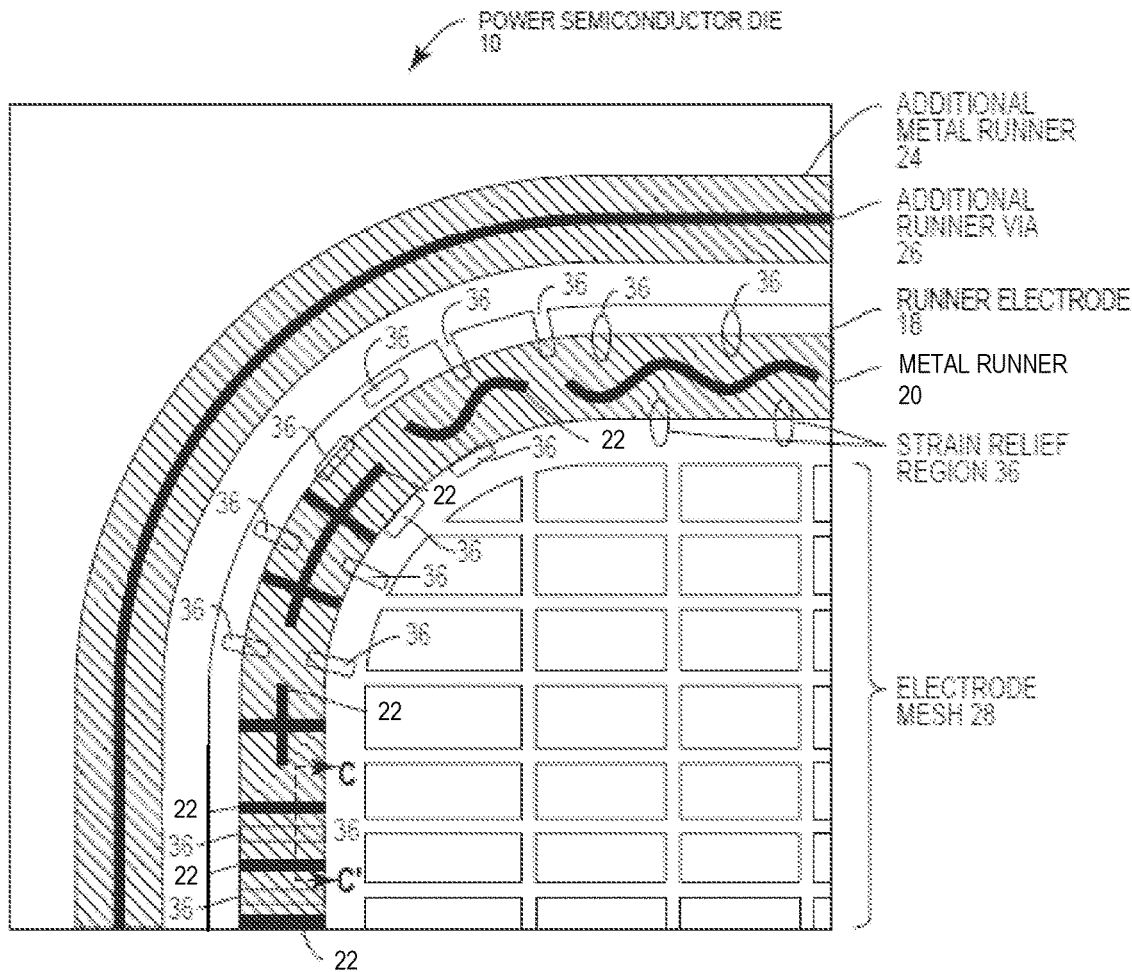
FIG. 9A is a top-down view of a corner of a power semiconductor die according to one embodiment of the present disclosure.

FIG. 9A shows a top-down view of a corner of the power semiconductor die 10 according to one embodiment of the present disclosure. The passivation layer 27 is not shown to avoid obscuring the drawing. The embodiment shown in FIG. 9A combines the strain relief regions 36 in the runner electrode 18 shown in FIG. 7A with the modifications to the runner via 22 shown in FIG. 8A. The combination of these changes may further reduce strain, thereby improving the reliability of the power semiconductor die 10.

Figure 9B:
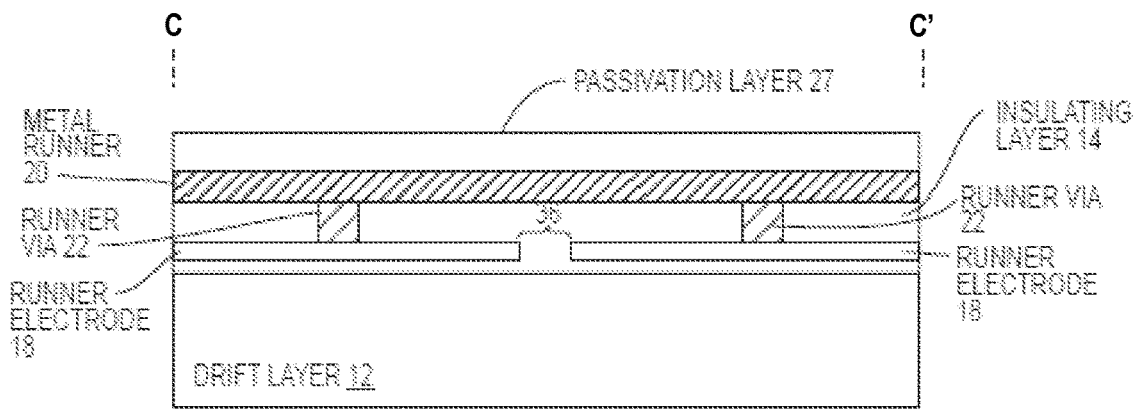
FIG. 9B is a cross-sectional view of a portion of a power semiconductor die according to one embodiment of the present disclosure.

FIG. 9B shows a cross-sectional view of the power semiconductor die 10 through line C-C' to illustrate the strain relief region 36 and segmentation of the runner via 22.

Figure 10:
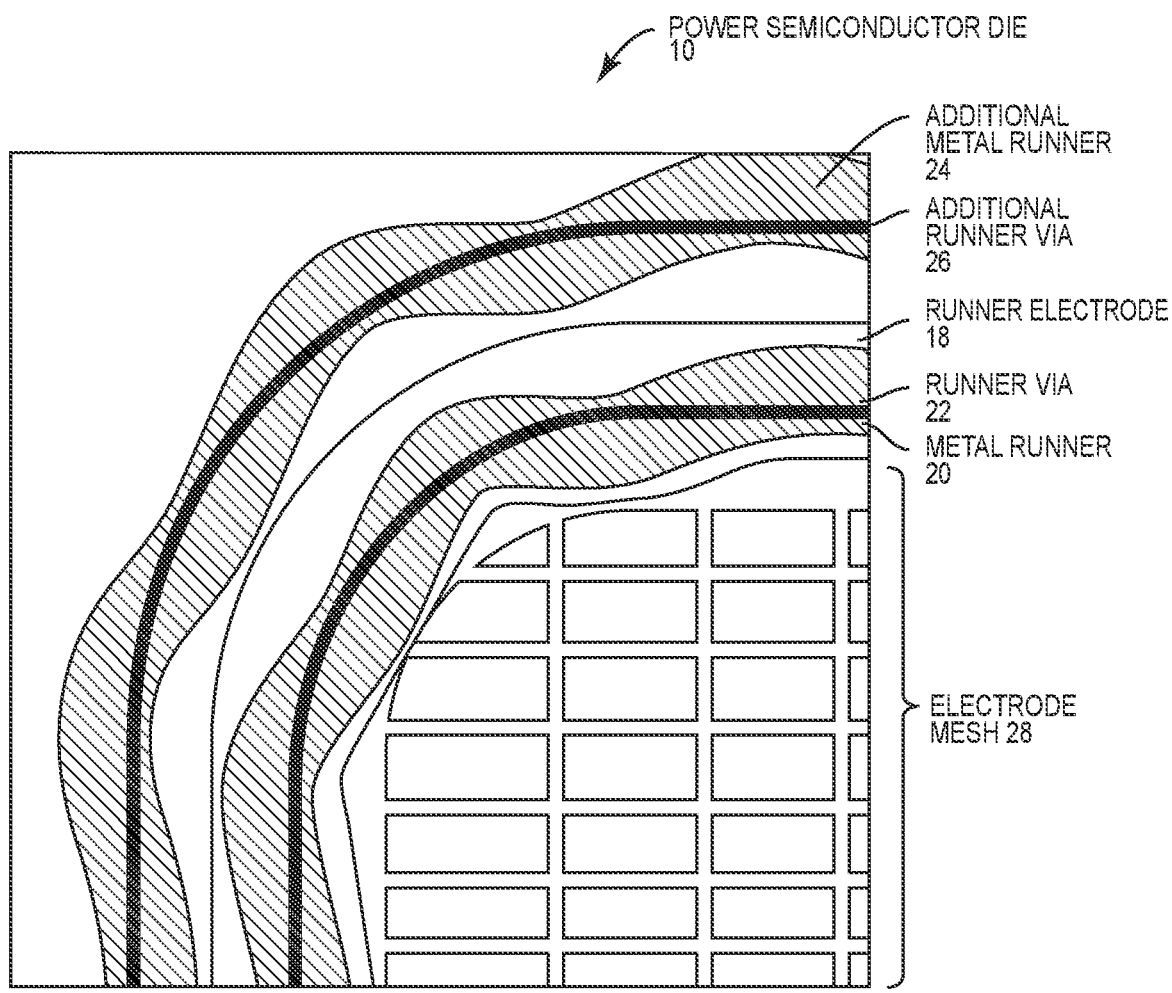
FIG. 10 is a top-down view of a corner of a power semiconductor die according to one embodiment of the present disclosure.

FIG. 10 shows a top-down view of a corner of the power semiconductor die 10 according to one embodiment of the present disclosure. The passivation layer 27 is not shown to avoid obscuring the drawing. In this embodiment, the path of the metal runner 20 is not the same as the path of the runner electrode 18 or the path of the runner via 22. In other words, the path of the metal runner 20 is not overlapping with or parallel to the path of the runner electrode 18 or the path of the runner via 22. As shown, the path of the metal runner 20 is provided in a serpentine manner. However, the path of the metal runner 20 may be provided in any arbitrary manner without departing from the principles of the present disclosure. The inner edge of the runner electrode 18 is also provided such that it is not parallel with the path of the runner electrode 18, but rather follows the inner edge of the metal runner 20. Providing the metal runner 20 and the runner electrode 18 in this manner may reduce strain, thus improving reliability of the power semiconductor die 10.

Figure 11:
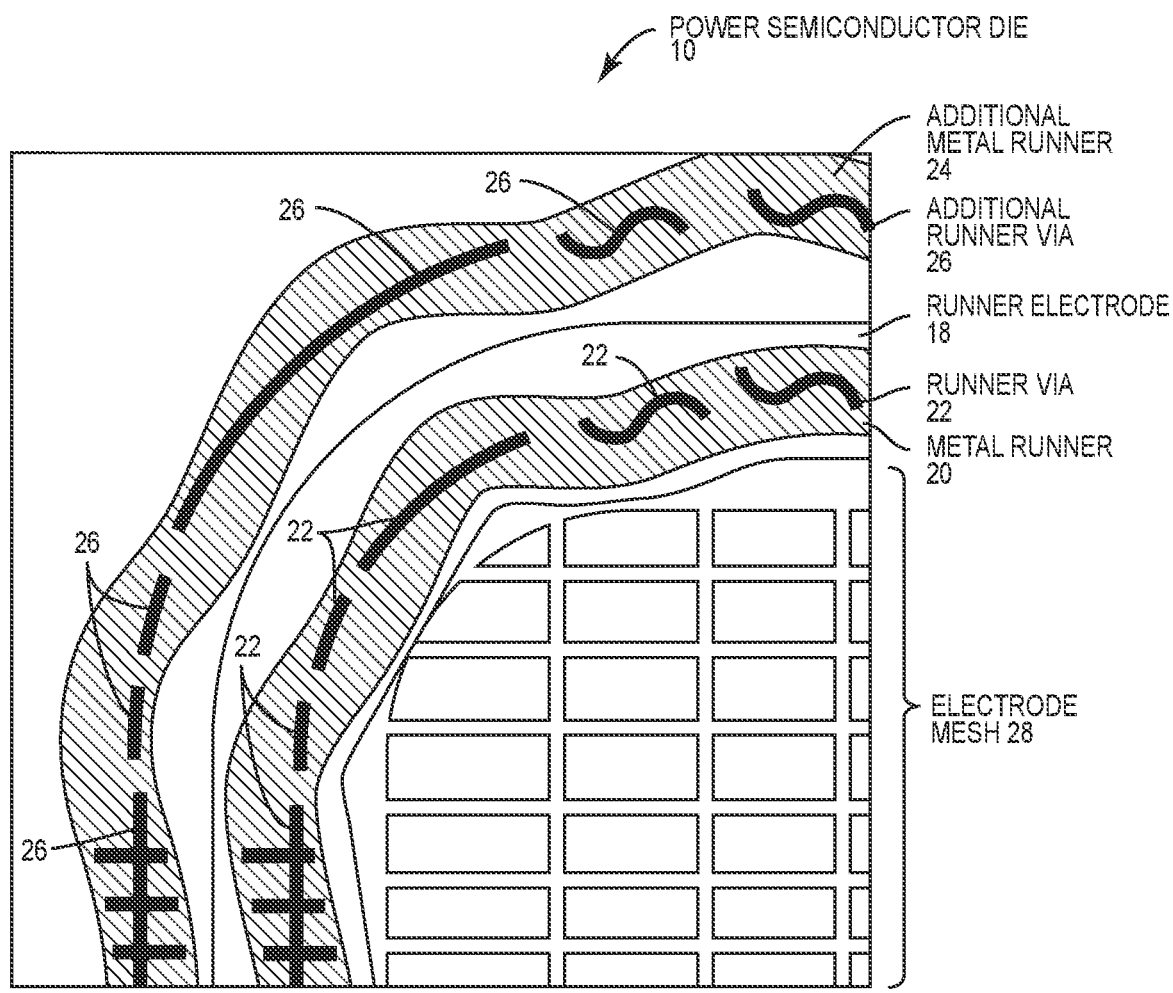
FIG. 11 is a top-down view of a corner of a power semiconductor die according to one embodiment of the present disclosure.

FIG. 11 shows a top-down view of the power semiconductor die 10 according to one embodiment of the present disclosure. The passivation layer 27 is not shown to avoid obscuring the drawing. This embodiment essentially combines the modifications to the runner via 22 discussed above with respect to FIG. 8A with the modifications to the metal runner 20 discussed above with respect to FIG. 10. By combining these features, strain may be further reduced, thus improving the reliability of the power semiconductor die 10 even further.

While the modifications discussed above with respect to FIGS. 7-11 are in the context of the runner electrode 18, the metal runner 20, and the runner via 22, the same modifications can be made to the additional metal runner 24, and the additional runner via 26. Further, the same modifications can be made to the central electrode 30, the central electrode via 34, and the pad electrode 32 to reduce strain in these areas.

Figure 12:
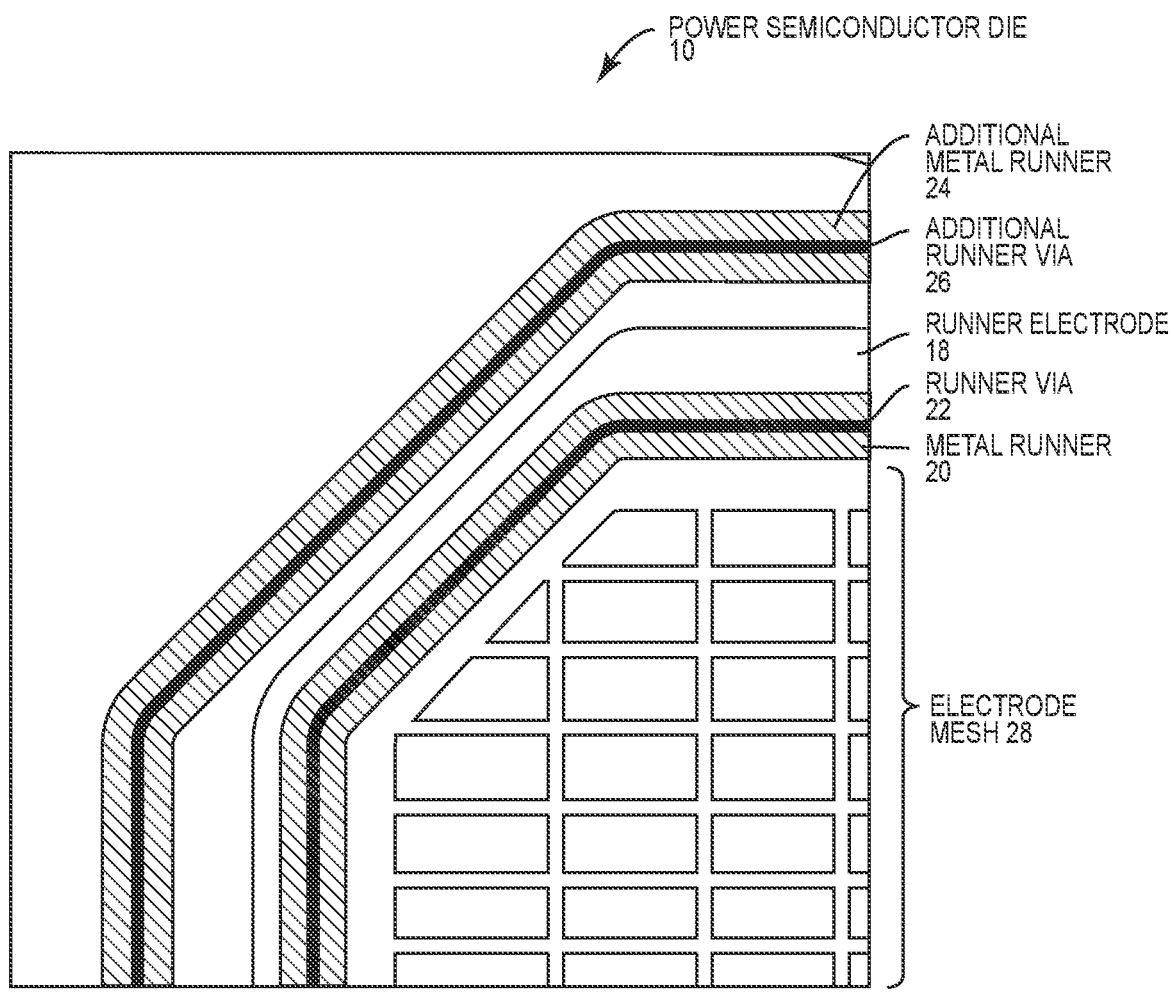
FIG. 12 is a top-down view of a corner of a power semiconductor die according to one embodiment of the present disclosure.

In addition to or separately from the improvements discussed above, the curvature of the path of the runner electrode 18, the metal runner 20, the runner via 22, the additional metal runner 24, and the additional runner via 26 may be modified to reduce strain. In particular, the path defining the runner electrode 18, the metal runner 20, the runner via 22, the additional metal runner 24, and the additional runner via 26 may provide a chamfered corner with respect to the corner of the power semiconductor die 10 as shown in FIG. 12. Chamfering the path of the runner electrode 18, the metal runner 20, the runner via 22, the additional metal runner 24, and the additional runner via 26 may move these layers away from points experiencing the highest strain in the power semiconductor die 10, thereby reducing the possibility of complications and improving the reliability of the power semiconductor die 10.

Figure 13:
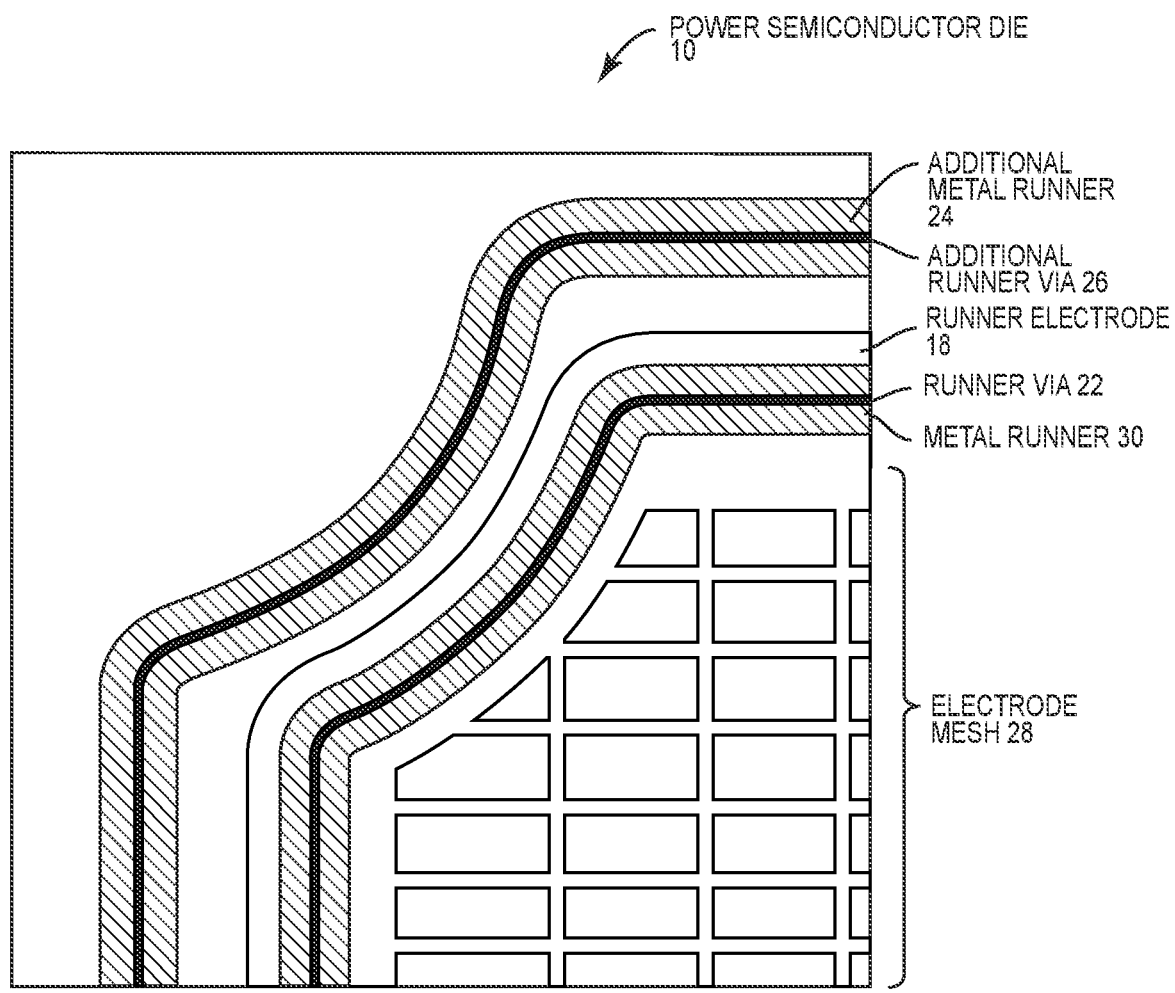
FIG. 13 is a top-down view of a corner of a power semiconductor die according to one embodiment of the present disclosure.

In another embodiment, the path of the runner electrode 18, the metal runner 20, the runner via 22, the additional metal runner 24, and the additional runner via 26 may provide an inverted radius with respect to the corner of the power semiconductor die 10 as shown in FIG. 13. Once again, this may move these layers away from the points of the power semiconductor die 10 which experience the highest degree of strain and thus improve the reliability of the power semiconductor die 10.

Figure 14:
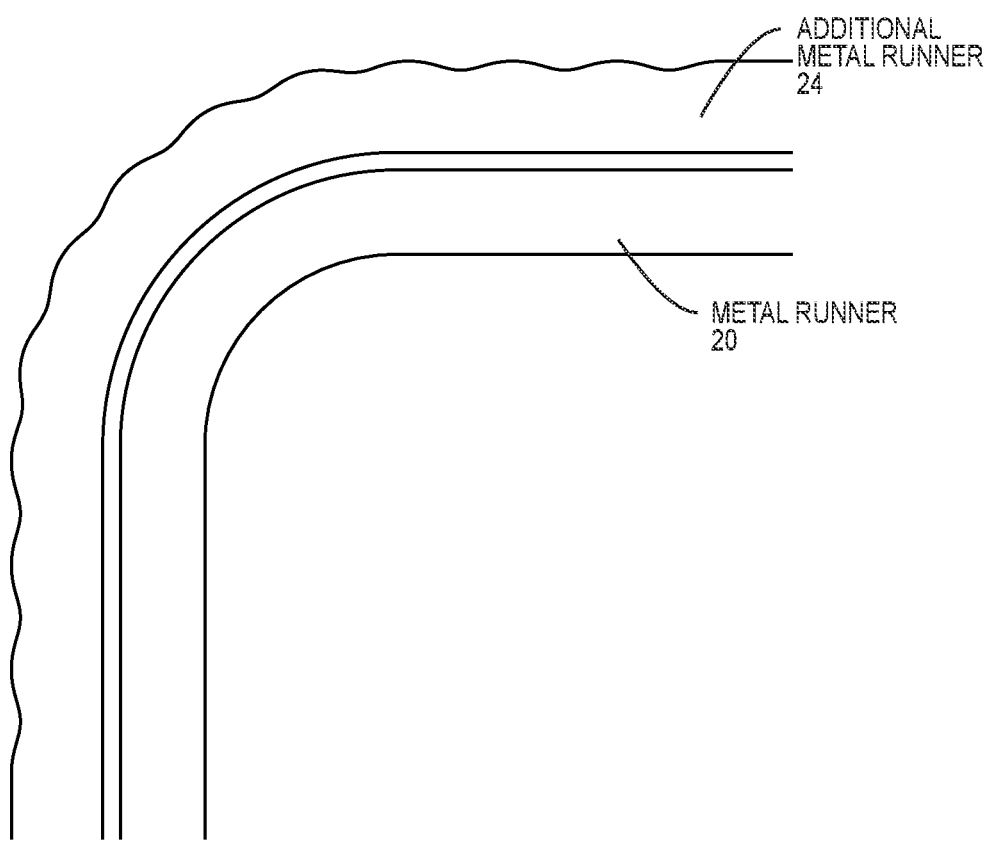
FIG. 14 illustrates a portion of features of a power semiconductor die according to one embodiment of the present disclosure.

In addition to or separately from the improvements discussed above, any of the runner electrode 18, the metal runner 20, the runner via 22, the additional metal runner 24, and the additional runner via 24 may be provided such that the inner edge thereof is not parallel to the outer edge thereof. FIG. 14 shows the additional metal runner having an outer edge that is not parallel to the inner edge thereof. In particular, FIG. 14 shows the additional metal runner 24 having an outer edge that is wavy or serpentine with a straight inner edge. The present disclosure contemplates the inner edge and/or outer edge having any arbitrary shape. While not shown, similar modifications can be made to the metal runner 20.

Figure 15:
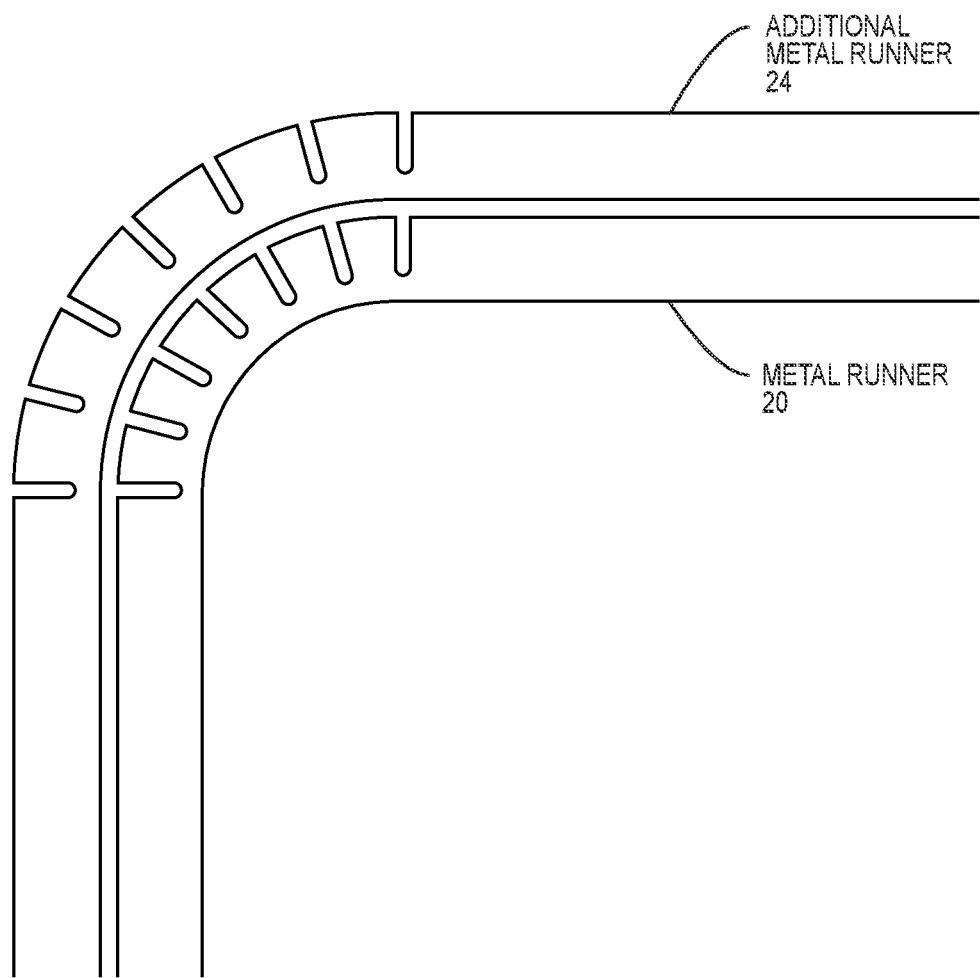
FIG. 15 illustrates a portion of features of a power semiconductor die according to one embodiment of the present disclosure.
Figure 16:
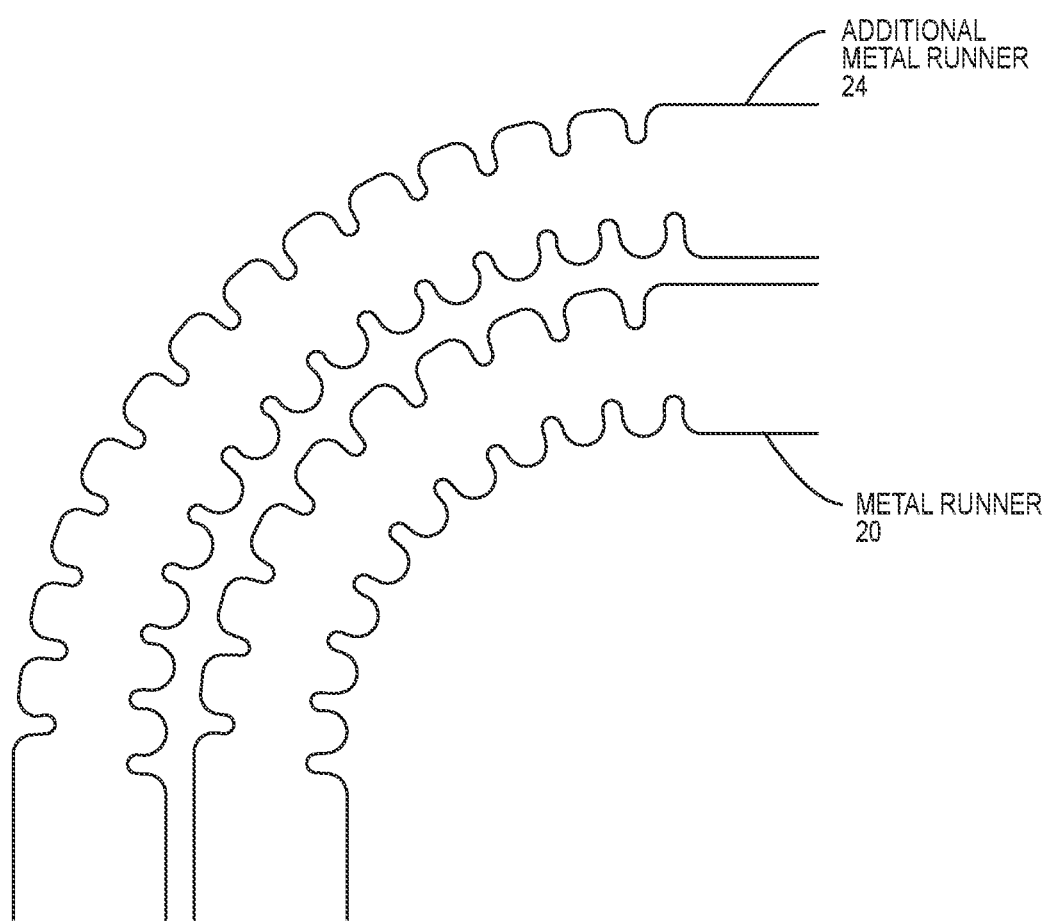
FIG. 16 illustrates a portion of features of a power semiconductor die according to one embodiment of the present disclosure.
Figure 17:
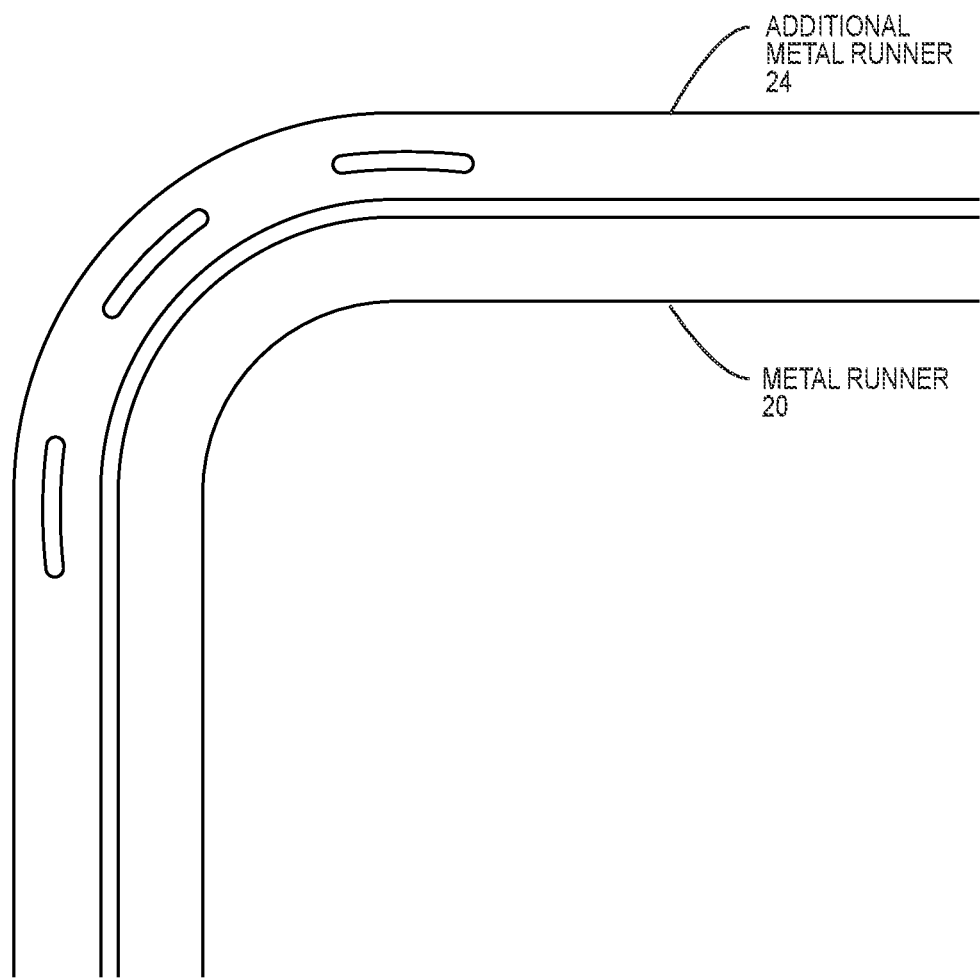
FIG. 17 illustrates a portion of features of a power semiconductor die according to one embodiment of the present disclosure.
Figure 18:
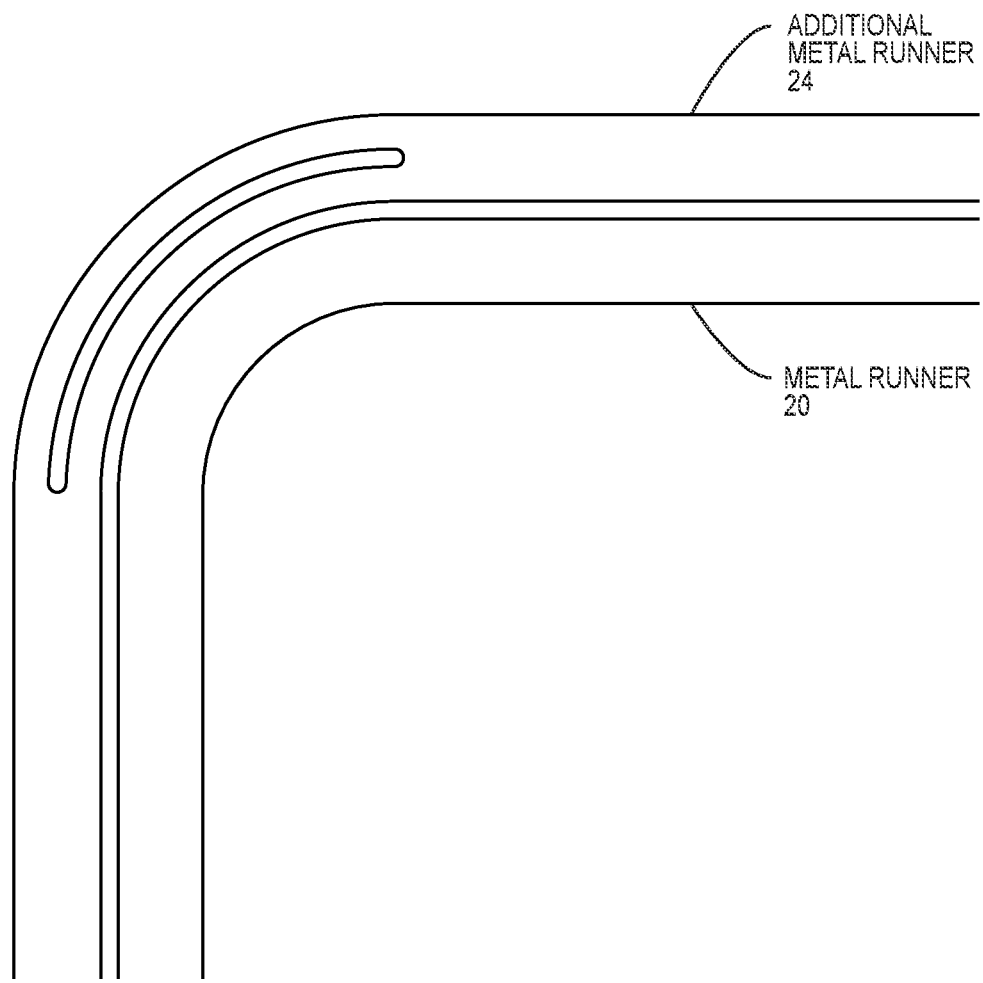
FIG. 18 illustrates a portion of features of a power semiconductor die according to one embodiment of the present disclosure.

In another embodiment, the outer edge of the metal runner 20 and/or the additional metal runner 24 may be slotted as shown in FIG. 15. The inner and outer edges of the metal runner 20 and/or the additional metal runner 24 may also be corrugated as shown in FIG. 16. Finally, inner portions of the metal runner 20 and/or the additional metal runner 24 may be omitted to form slots or other areas wherein the electrically conductive material of the metal runner and/or the additional metal runner 24 are not provided between the inner edge and outer edge thereof as shown in FIGS. 17 and 18, wherein FIG. 17 shows the additional metal runner 24 having several areas wherein the electrically conductive material thereof is not provided and FIG. 18 shows the additional metal runner 24 having a single continuous area wherein the electrically conductive material thereof is not provided.

In general, the present disclosure contemplates modifying the path, inner edge, and outer edge of any of the runner electrode 18, the metal runner 20, the runner via 22, the additional metal runner 24, and the additional runner via 26 to reduce strain and thus improve the reliability of the power semiconductor die 10. One way to measure the reliability of a semiconductor die 10, specifically with respect to strain-induced failures, is the failure rate of the semiconductor die 10 when subjected to a thermal cycling test. A thermal cycling test involves cycling a temperature of the semiconductor die 10 between a minimum temperature and a maximum temperature for a given number of cycles. In one embodiment, the minimum temperature is less than or equal to 40° C., the maximum temperature is greater than or equal to 150° C., and the number of cycles is at least 1000. In other embodiments, the thermal cycling test may be more rigorous such that one or more of the following conditions are applied: the minimum temperature is less than or equal to −55° C., the maximum temperature is greater than or equal to 175° C., and the number of cycles is greater than or equal to 2000, greater than or equal to 3000, and even greater than or equal to 5000. One or more of the improvements described herein may enable a power semiconductor die 10 having a failure rate less than 2000 parts per million when subjected to a thermal cycling test as described above. This is at least an order of magnitude less than conventional power semiconductor die without the improvements of the present disclosure. In various embodiments, the improvements described herein may enable even better reliability such that the power semiconductor die 10 has a failure rate less than 1000 parts per million, less than 500 parts per million, less than 100 parts per million, and less than 20 parts per million.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
   a drift layer that includes an active region;
   a runner electrode on the drift layer that extends along a runner electrode path;
   and
   a runner electrode strain relief region that comprises a closed region in which electrically conductive material is not provided that is surrounded by the runner electrode when the runner electrode is viewed from above.

2. The semiconductor device of claim 1 further comprising:

a runner via that extends along a runner via path, wherein the runner via is an opening in the insulating layer through which the runner electrode is exposed;

an additional runner via that extends along an additional runner via path, wherein the additional runner via is an opening in the insulating layer; and an additional metal runner along an additional metal runner path, the additional metal runner within the additional runner via to electrically contact the drift layer.

3. The semiconductor device of claim 2 wherein the additional runner via is segmented to provide a plurality of segmented additional runner vias that are separated by a portion of the insulating layer.

4. The semiconductor device of claim 3 wherein the additional runner via path is not the same as the additional metal runner path.

5. The semiconductor device of claim 3 wherein one or more of the plurality of segmented additional runner vias comprise a first via portion that intersects a second via portion.

6. The semiconductor device of claim 1 further comprising an electrode mesh over the active region and coupled to the runner electrode, the electrode mesh comprising a grid of electrode mesh runners running between opposing sides of inner edges of the runner electrode.

7. The semiconductor device of claim 6 wherein the runner electrode strain relief region is not positioned so that it is intersected by a line defining the path of any one of the grid of electrode mesh runners.

8. The semiconductor device of claim 1 wherein the insulating layer fills the runner electrode strain relief region.

9. The semiconductor device of claim 2 wherein the runner via includes a serpentine segment.

10. The semiconductor device of claim 2 wherein the runner via is at least partly in a cross-hatched pattern where a first via portion overlaps a second via portion.

11. The semiconductor device of claim 10 wherein the first via portion is perpendicular to the second via portion.

12. The semiconductor device of claim 1 wherein the metal runner includes curved corners.

13. The semiconductor device of claim 1 wherein a portion of the insulating layer is in between the drift layer and the runner electrode.

14. The semiconductor device of claim 2 wherein the additional metal runner is positioned outside the runner electrode.

15. A semiconductor device comprising:
an active region;
an insulating layer on the active region;
a runner electrode that has curved corners;
a runner via on the runner electrode; and
a metal runner along a metal runner path such that the metal runner fills the runner via.

16. The semiconductor device of claim 15 wherein the runner via is segmented to provide a plurality of segmented runner vias.

17. The semiconductor device of claim 16 wherein one or more of the plurality of segmented runner vias comprise a first via portion that intersects a second via portion.

18. The semiconductor device of claim 15 wherein the runner electrode includes one or more closed runner electrode strain relief regions that do not include an electrically conductive material.

19. The semiconductor device of claim 15 wherein the runner via includes a serpentine segment.

20. The semiconductor device of claim 17 wherein the first via portion is perpendicular to the second via portion.

21. The semiconductor device of claim 16 wherein the segmented runner vias are separated by respective portions of the insulating layer.

22. The semiconductor device of claim 16 further comprising an additional runner via that is segmented to provide a plurality of additional segmented runner vias, wherein the additional runner via is not electrically connected to the runner via.

23. The semiconductor device of claim 15 wherein a width of the metal runner is less than a width of the runner electrode.

24. The semiconductor device of claim 15 wherein a portion of the insulating layer is in between the drift layer and the runner electrode.

25. The semiconductor device of claim 15 further comprising:
an additional runner via that extends along an additional runner via path, wherein the additional runner via is an opening in the insulating layer; and
an additional metal runner along an additional metal runner path, the additional metal runner filling the additional runner via to electrically contact the drift layer,
wherein the additional metal runner includes curved corners.

26. A semiconductor device comprising:
a drift layer that comprises an active region;
a runner electrode on the drift layer;
a metal runner that comprises an electrically conductive material, the metal runner extending along a metal runner path that follows a perimeter of the active region;
an insulating layer, where a portion of the insulating layer is in between the runner electrode and the metal runner;
wherein a width of the metal runner is less than a width of the runner electrode.

27. The semiconductor device of claim 26 wherein the runner electrode includes curved corners.

28. The semiconductor device of claim 26 wherein the additional metal runner includes curved corners.

29. The semiconductor device of claim 26 wherein the metal runner includes curved corners.

30. The semiconductor device of claim 26, further comprising:
an additional runner via that extends along an additional runner via path, wherein the additional runner via is an opening in the insulating layer; and
an additional metal runner that fills the additional runner via to electrically contact the drift layer.

31. The semiconductor device of claim 26 wherein a portion of the insulating layer is in between the drift layer and the runner electrode.

* * * * *

UNITED STATES PATENT AND TRADEMARK OFFICE
CERTIFICATE OF CORRECTION

PATENT NO. : 11,869,948 B2
APPLICATION NO. : 17/177641
DATED : January 9, 2024
INVENTOR(S) : Lichtenwalner et al.

It is certified that error appears in the above-identified patent and that said Letters Patent is hereby corrected as shown below:

In the Specification

Column 6, Line 44: Please correct "421" to read --42I--

Column 6, Line 45: Please correct "420" to read --42O--

Column 6, Line 46: Please correct "421" to read --42I--

Column 6, Line 46: Please correct "420" to read --42O--

Column 6, Line 47: Please correct "421" to read --42I--

Column 6, Line 47: Please correct "420" to read --42O--

Column 6, Line 49: Please correct "421" to read --42I--

Column 6, Line 50: Please correct "420" to read --42O--

Column 6, Line 51: Please correct "421" to read --42I--

Column 6, Line 53: Please correct "420" to read --42O--

Column 6, Line 54: Please correct "421" to read --42I--

Column 6, Line 55: Please correct "420" to read --42O--

Column 6, Line 57: Please correct "421" to read --42I--

Column 6, Line 57: Please correct "420" to read --42O--

Signed and Sealed this
Ninth Day of April, 2024

Katherine Kelly Vidal
*Director of the United States Patent and Trademark Office*